US006383710B2

(12) United States Patent
Hare et al.

(10) Patent No.: US 6,383,710 B2
(45) Date of Patent: *May 7, 2002

(54) HAND APPLICATION TO FABRIC OF HEAT TRANSFERS IMAGED WITH COLOR COPIERS/PRINTERS

(75) Inventors: Donald S. Hare; Scott A. Williams, both of Hawley, PA (US)

(73) Assignee: Foto-Wear!, Inc., Milford, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/907,634

(22) Filed: Jul. 19, 2001

Related U.S. Application Data

(62) Division of application No. 09/478,458, filed on Jan. 6, 2000, which is a division of application No. 09/115,691, filed on Jul. 15, 1998, now Pat. No. 6,083,656, which is a division of application No. 08/816,890, filed on Mar. 13, 1997, now Pat. No. 5,948,586.
(60) Provisional application No. 60/013,193, filed on Mar. 13, 1996.

(51) Int. Cl.⁷ ............................ G03C 11/12; G03C 11/14
(52) U.S. Cl. ...................... 430/256; 430/262; 430/352; 156/235; 156/240
(58) Field of Search ................................. 430/138, 256, 430/262, 259, 263, 350, 352, 235, 237; 156/235, 240; 428/914

(56) References Cited

U.S. PATENT DOCUMENTS

| | | |
|---|---|---|
| 1,799,754 A | 4/1931 | Lawrence |
| 4,064,285 A | 12/1977 | Mammino |
| 4,224,358 A | 9/1980 | Hare |
| 4,284,456 A | 8/1981 | Hare |
| 4,351,871 A | 9/1982 | Lewis et al. |
| 4,715,914 A | 12/1987 | Viner |
| 4,773,953 A | 9/1988 | Hare |
| 4,966,815 A | 10/1990 | Hare |
| 4,980,224 A | 12/1990 | Hare |
| 5,032,449 A | 7/1991 | af Strom ..................... 428/195 |
| 5,098,772 A | 3/1992 | af Strom ..................... 430/211 |
| 5,139,917 A | 8/1992 | Hare .......................... 430/138 |

(List continued on next page.)

FOREIGN PATENT DOCUMENTS

| | | |
|---|---|---|
| EP | 649753 A1 | 4/1995 |
| FR | 2690873 | 10/1980 |
| FR | 2452381 | 11/1993 |
| GB | 1216613 | 12/1970 |
| JP | 3018649 | 9/1995 |
| WO | WO9103766 | 3/1991 |

OTHER PUBLICATIONS

Instructions for Use—Copyfantasy CTM 50, Messerli Information Technology (Mouse–pads, T–shirts, cotton bags, etc.).
"Using Canon T–Shirt Transfers TR–101," 1995 Canon Computer Systems, Inc., form CST–4051–002.
Hard Copy Supplies Journal, Apr. 1996 edition, "Messerli Debuts State–of–the–Art Media for Ink Jet, Laser", pp. 16–17.

Primary Examiner—Richard L. Schilling
(74) Attorney, Agent, or Firm—Birch, Stewart, Kolasch & Birch, LLP

(57) ABSTRACT

The present invention relates to a method for applying an image to a fabric, which comprises the steps of (i) hand ironing an imaged copier or printer transfer material having a support sheet and a transfer coating to a receptor element having valleys on the surface of the receptor element, (ii) peeling away the support sheet to obtain an imaged receptor element, (ii) placing a tack-free overlay sheet over the imaged receptor element, and (iv) pressing the overlay sheet by hand ironing to drive the coating into the valleys of the receptor element.

10 Claims, 1 Drawing Sheet

U.S. PATENT DOCUMENTS

| | | | |
|---|---|---|---|
| 5,236,801 A | 8/1993 | Hare | 430/138 |
| 5,242,739 A | 9/1993 | Kronzer et al. | 428/200 |
| 5,271,990 A | 12/1993 | Kronzer et al. | 428/195 |
| 5,407,729 A | 4/1995 | Verden et al. | 428/196 |
| 5,419,944 A | 5/1995 | Sammis | |
| 5,424,141 A | 6/1995 | Croner | 428/200 |
| 5,501,902 A | 3/1996 | Kronzer | 428/323 |
| 5,620,548 A | 4/1997 | Hare | 156/240 |
| 5,798,179 A | 8/1998 | Kronzer | 428/411.1 |
| 5,948,586 A * | 9/1999 | Hare et al. | 430/138 |
| 6,087,061 A | 7/2000 | Hare et al. | 430/138 |
| 6,096,475 A | 8/2000 | Hare et al. | 430/138 |

* cited by examiner

HAND APPLICATION TO FABRIC OF HEAT TRANSFERS IMAGED WITH COLOR COPIERS/PRINTERS

This application is a divisional of co-pending application Ser. No. 09/478,458, filed on Jan. 6, 2000, which is a divisional of application Ser. No. 09/115,691 filed on Jul. 15, 1998, now U.S. Pat. No. 6,083,656 which is a divisional of Ser. No. 08/816,890 filed on Mar. 13, 1997, now U.S. Pat. No. 5,948,586 the entire contents of which are hereby incorporated by reference and for which priority is claimed under 35 U.S.C. §120; and this application claims priority of Application No. 60/013,193 filed in the United States on Mar. 13, 1996 under 35 U.S.C. §119.

BACKGROUND OF THE INVENTION

The present invention relates to a method for applying an image to a receptor element using two heating steps.

The major user of color copiers to create personalized transfers are copy shops (e.g. Kinko's) which use commercial laser color copiers, such as the Canon #500/700/800 or the Xerox Spectrum. The machines cost $30,000 and more. A commercial heat press is required to effect transfer.

Because a commercial press is necessary, the stores must also carry an inventory of apparel since the consumer can not shop elsewhere and apply a transfer at home. Presently, transferring images to receptor elements require costly machines, combined with the requirement for an inventory of apparel, a commercial and costly heat press (e.g. $4,000+). These demands prevent consumers from having easy access within the course of one's everyday living experience.

For the past 20 years, transfers could only be printed at copy stores, plus a few high traffic specialty locations, such as amusement parks, tourist centers, etc. Access to these machines was limited. First, not many of the copy shops would spend the $30,000–50,000 per machine. Certainly not the smaller shops in more remote areas. Second, most frequently, T-shirt personalization is an impulse and very few people have occasion to visit copy centers frequently, or on a somewhat regular basis. Third, the copy centers would be required to have at least one commercial heat press (as hand ironing was impossible), plus a variety of T-shirts in different sizes. This in-store inventory of shirts was necessary, because the imaged transfer had to be pressed into the garment at the store. Fourth, copy centers have no desire to carry an assortment of apparel in differing designs and sizes.

Traditionally, copy centers in the imaging transfer business do not inventory anything other than T-shirts and, on occasion, a baseball jersey and cap. The consumer had no range of choices with regard to gift items, such as pillowcases, barbecue aprons, tote bags, windbreakers, sweatshirts, etc. And certainly no range of colors.

Supermarkets, Drugstores, etc., find it is not cost effective to devote so many resources (i.e. costly copier, commercial press, and wide range of apparel in inventory) for the return on investment. Consequently, consumers lose because they do not have routine access to obtain personally imaged apparel.

No supermarket or mass merchandiser (eg. K-Mart, Wal-Mart, etc.) has the personnel, the time, or the space to have the copier, along with compulsory commercial heat press, plus a wide range of garments. However, offering the many store visitors, in high traffic locations cited above, the capability to copy a photo just being received in the store after development of film, or a wallet photo, a prom picture, graduation picture, or simple "refrigerator art" provides a significantly better opportunity to both the consumer and the store management.

One problem in the art is that the internal heat of toner laser imaging devices exceeds the melt point of any "hand ironable" transfer. The problem has been apparent for 20 years when Xerox introduced its first commercial toner color copier. In 20 years, no one has found a successful method to achieve hand ironing of toner laser transfers.

The modifications will follow description of the fundamental 20 years inability to hand iron laser toner transfers. All transfers must have a meltpoint higher than the fuser rollers within toner copiers. This meltpoint is a combination of temperature, the amount of time that the transfer is in contact with fuser roller, and pressure applied to transfer as it passes over the roller.

Papers are available but each can only pass through the copier with an imprinted image, and not melt when undergoing the printing procedure. However, because the meltpoint must be so high (350–400° F. for 20 seconds) the transfer must be heat pressed. Should one try to hand iron, the iron would have to be, at its highest temperature, over each area, one at a time and for 20 seconds, until the 8.5"×11 or 11"×17" transfer had been completely covered with the iron for 20 seconds. On the 8.5"×11" size, it would require about eight (8) changings of the location of the iron to press the entire surface. It is inevitable that when the last position of the iron had been completed, the iron placed upon the table, and peel of transfer begun, you will often find that the first sections of those transfers which had been pressed had since cooled and the transfer must, inevitably with many current "hot peel," stick to the fabric. The consumer could never peel the transfer from the fabric without a great deal of drag (i.e., resistance to peel). This drag would lift the piles of the fabric upward thus leaving the color unprotected at the extreme tips of the fibers. The present inventor found that if the colored coating is not compressed into the fabric, color will be significantly lost in laundering, coatings will develop cracks, feel will be rough, and colors are less vibrant.

This inability to hand iron is a universal problem today, with exceptions only in degree. Some coatings are marginally acceptable, others are not. Therefore, the restrictions for both consumer and the stores remain intact, as they have for 20 years.

SUMMARY OF THE INVENTION

An object of the present invention is to overcome the problems identified above.

The present invention improves adhesion and image quality of an image that has been transferred (e.g. imaged transfer) after it has been applied to a receptor element such as a fabric. This is achieved by re-ironing the already transferred image utilizing a material resistant to sticking (i.e. a tack resistant material such as silicone paper) between the hand-held iron and the transferred image on the receptor element. This is necessary in many, but not all, instances so as to drive the coatings which have been transferred from the support sheet of the transfer material to the receptor element (i.e. fabric) deep into the gaps and valleys of the receptor element. The repress method of the invention also compresses any loose fabric thereby making the colors more vibrant.

There are two reasons why some coatings are more significantly improved than others with a second press (re-iron):

1. The support sheet of some transfers are so rigid and thick as to prevent hand pressure from the iron to drive the coatings into the gaps. If the paper is too thick or rigid, it spans the tiny gaps in the fabric and simply prevents an iron, with the energy of one's hand, to drive the coatings sufficiently into the fabric.
2. Some coatings do not melt as readily (e.g. liquify) as others when exposed to heat (and pressure). Therefore, the iron must remain at a given location for a longer period of time. As a result, the initial starting location of the iron will have cooled so as to create greater drag or resistance of peel.

In the instance of printing/copier devices which require a high degree of internal heat, coatings must have a melt point so high as to exceed that of the printer. The higher the melt point the higher the temperature that is required for release. The higher the temperature, the greater the drag because the initial positions have cooled to varying degrees. As a result; the coatings will simply rest atop the fabric and span crevices rather than follow the texture and fill the gaps.

Reasons for the necessity of either a rigid support or higher melt point coatings are:

1. Many cassette feeders require a stiffer paper to avoid jamming.
2. Some copiers/printers require stiffer paper to avoid jamming as the paper passes through the various internal processes. In those instances, a more pliable support sheet will get "hung up" at certain junctions and create an unacceptable incidence of jamming.
3. As previously mentioned, some coatings require a formula which results in a higher melt point to avoid activating and wreaking havoc with the interior of the device.

Those coatings with higher melt points will not flow into the valleys of the fabric with the pressure of only a hand iron. Presently, the only method in the art to achieve adequate transfer from support sheet to fabric of the imaged coatings is with the use of a commercial heat press. The repress method of the present invention overcomes the problem in the art.

A hand-ironable transfer would enable many locations, which currently do not offer Personalized Apparel services because of the many restrictions, to provide this service and enjoy a profit.

Thus, in one embodiment of the invention, the consumer would simply have a copy (i.e. color) made of a photo or artwork (e.g. greeting cards) onto a hand ironable transfer material. Then he/she could shop for the specific receptor element of preference, varying from pillowcases, aprons, nite/beach/baseball jerseys, t-shirts, etc. upon which to transfer the image (i.e. an imaged transfer) in accordance with the process of the present invention.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein:

FIG. 2 illustrates the first of two ironing steps for ironing an image onto a tee shirt or the like.

DETAILED DESCRIPTION OF THE INVENTION

Figure 1:
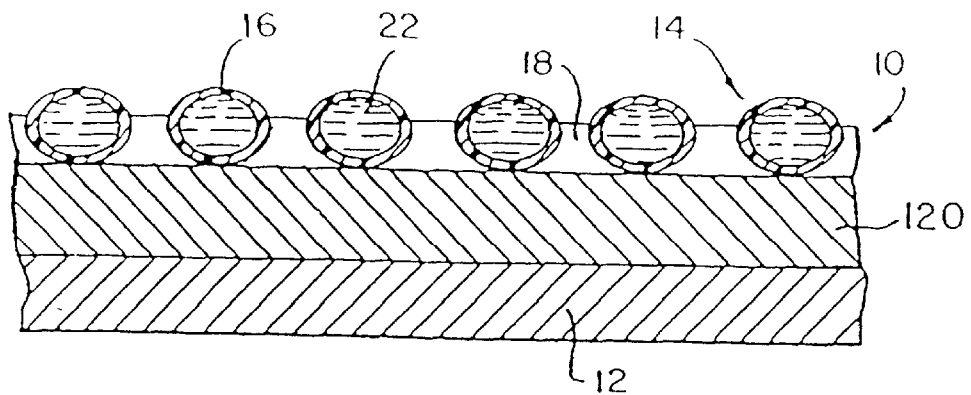
FIG. 1 is a cross-sectional view of a transfer material using CYCOLOR technology which may be used in the claimed process.

With the present invention, the consumer could copy or reproduce the image of his/her choice onto known transfer products, shop for the best receptor element such as an apparel of choice, and iron the transfer to a garment at home. Thousands of hitherto unavailable locations could now provide the capability to consumers to personalize apparel for giving or wearing. These many new locations would enjoy a significant new profit opportunity, with a minimum investment in space, personnel, and assorted apparel.

The advantages of "Hot Peel Transfers" of the present invention:

1. Laser copiers could be located in supermarkets, super drug stores, mass merchandisers, etc.
2. Millions of consumers, worldwide, can copy beautiful color images for transfer to fabric at home.

The present invention(s) enable consumers to hand iron transfers to fabric, thus allowing for the benefits herein mentioned.

A fabric consists of peaks and valleys. The degree of both are determined by the diameter of the fiber and the tightness of the weave. A fine fiber, tightly woven, will have many fewer valleys and of lesser depth than a heavier yarn loosely woven. As a result of this uneven surface, a burden is placed upon the transfer coatings (i.e. carrier material which is capable of both release and adhesion, plus the image). They must be driven into the valleys as well as cover the surface of the strands to prevent or at least reduce cracking of the surface after the transfer has been applied. A commercial heat press has sufficient pressure to drive the coatings deeply into the valleys of the fabric. A hand iron does not.

The reason that the hand iron is not sufficient to drive the coatings into the valleys is that the support sheet is sufficiently rigid to resist the hand pressure. As a result, the coatings actually "span" the valleys rather than penetrate into them.

The reasons why it is imperative not to allow the coatings to merely rest upon the fabric surface are:

1. Stress cracks will appear as the garment is worn.
2. Washability is minimized and colors are destined to fade significantly after only 2–5 washings.

When coatings are properly integrated into the fabric, one can expect a minimum of 25 washings, and, more often than not, well above 50.

3. The stiffness is objectionable. "HAND" as it is referred to within the imprinted sportswear industry, is of extreme importance to consumers. Softness is a major consideration.
4. Colors should be vivid. When the support sheet is peeled from the fabric after having been hand ironed, the tiny fabric tips tend to "lift", rather than remain condensed as they would with a heat press.

It first appears as though color has been lost, but after re-pressing, the intensity of color improves markedly.

The re-press method enables one to use a copier such as the family Canon Laser Copiers wherever it is available, in order to copy or print the desired image onto a transfer material at a retail location and hand iron the personalized imaged transfers at home.

Although the melt point must be high and the paper rigid so as to prevent excessive jamming, the consumer can iron small sections at a time and peel at maximum heat. By doing small sections (e.g. 3×4) one can work his/her way over the entire transfer, one small area after another, and peel the support sheet before it begins to cool.

The more it cools, the greater the resistance between the coatings and the support sheet. The greater the pull of paper (i.e. resistance), the less the gaps will be filled. The consequences are defined above. However, by ironing in small sections to minimize resistance, and then re-ironing, one can drive the coatings with highest melt points and stiffest of support sheets deeply into the fabric.

The re-pressing with a hand iron is beneficial, even necessary, in many situations, as described above.

Existing transfer materials therefore provide an adequate transfer of most of the desired image to the receptor element. However, in-order to ensure the transfer of all or substantially all of the desired image to the receptor element without the above-mentioned shortfalls of quality and protection, the present inventor recognized that an additional heating step after transfer would be useful in improving the home imaged transfer process.

Therefore, the use of a non-stick, tack-free overlay sheet, such as a silicone sheet, provides a distinct advantage because it is considerably less rigid than the original support for the transfer material and the consumer can apply pressure for a much longer time. The additional time is made possible because the coatings do not stick to the non-stick, tack-free overlay sheet (e.g. silicone paper) and the consumer does not have to worry about spending additional pressing time which would otherwise result in excessive adhesion or drag of support sheet to receptor surface.

It is imperative that an overlay sheet is placed over the imaged fabric before contact with the iron is made in the re-pressing process. If not, the coatings would simply activate (e.g. remelt) and adhere to the iron. The garment would be ruined. An overlay sheet must be made of a material which resists "sticking" of the transferred image thereto so as to prevent remelted coatings from sticking to the re-press sheet. Treated papers, such as teflon or silicone, are some examples of stick-resistant re-press papers (e.g. overlay sheets). With use of a non-stick, tack-free overlay sheet, one can apply full body weight for as long as a minute or more, but most commonly at about 15 seconds per position of the iron at the maximum iron temperature. This drives the coatings deeply into the fabric and compresses any loose fabric. The receptor element is allowed to cool for a minute or so, and the overlay is peeled with no resistance. No coatings will have adhered to the overlay sheet and a vivid, soft, highly washable, and crack-resistant image will remain on the item of the consumer's choice.

Because of the use of a hand iron for home application of the transfer, the consumer is not "locked" into the very narrow choice of apparel in the very few locations where the transfer copy service is currently available. The consumer can simply copy the desired image onto conventional transfer material, select from a wide variety of fabric garments readily available in retail stores and, by utilizing the method of the invention, apply transfer at home without the problems identified above (i.e. incomplete transfer).

The tack-resistant and stick-resistant overlay, such as commercially available silicone paper, could be included in a kit along with a conventional transfer material and ironing instructions and provided to the consumer in a small bag for home application. This kit could be purchased and the transfer material could be imaged by conventional means such as by copying or printing either at a business having a copier or printer or at home (with a personal computer and printer) thereby providing an imaged transfer material. The image is then transferred according to the process of the present invention.

The use of a non-stick overlay allows for a quality transfer created by a larger selection of color imaging devices found in a vast assortment of readily accessible locations. Consumers will have new opportunities to wear and give personalized items. They will not be limited to a select few stores (copy—centers primarily), a very limited selection of items, primarily white t-shirts, and will also enjoy a considerably reduced price.

For example, copy-centers have a captive audience. The consumer must choose the items which the store offers because it must be pressed on site. The store gets what the traffic will bear for a "finished product", (e.g. $12.00–$14.95 in 1997 dollars is an accurate average for a personalized t-shirt). With the ability to iron at home made possible by the overlay and re-press method of the invention, the consumer needs only copy (i.e. color) the desired image onto a transfer material ($3.95–$5.95) and transfer the image to a T-shirt ($3.50). The savings on an imaged T-shirt would minimally approximate $5.00. One could have a personalized sweatshirt, nite-shirt, or nylon windbreaker for the same, or slightly higher, than the current average cost for a T-shirt. Therefore, the overlay and re-press method provides for the consumer greater access, lower prices, and much greater selection of personalized items.

Although commercially available silicone paper is the preferred material for use in the second heating step of the invention, other similar materials may be used. For instance, if tackiness or stickiness is not an extremely severe problem, bond paper, wax paper, or butcher paper may be substituted for the silicone paper. The amount of anti-stick property of the overlay sheet depends on the tackiness of the transfer material which is selected. The choice of suitable non-stick overlay sheets is therefor readily determined by one of ordinary skill in the art.

The preferred procedure of the invention is as follows:
1. Hand ironing the rear surface of the imaged transfer material in order to transfer the image to fabric and peeling away the support sheet. (The imaged transfer material comprises (i) a support, a transfer layer capable of release without water and capable of providing adhesion, and an image receptive layer, or (ii) a support and a combined transfer/image receptive layer. Separate surface adhesives are entirely unnecessary.)
2. Placing a thin silicone sheet over the imaged fabric (i.e. imaged transfer) and pressing with a hand held iron to drive the coatings into the valleys of the fabric.

When the silicone sheet is pressed with the iron over the coatings immediately after the original transfer had been applied, it gives the fabric a softer feel because it has filled the voids in the fabric and significantly reduces cracking of the surface because the voids are not spanned but rather filled.

Because the coatings have been compressed more so with the silicone than without, the colors are significantly more resistant to laundering than they would otherwise be.

After fabric which has received a transferred image and has been laundered several times, the fibers of said fabric begin to lift. The result is the appearance of a color loss which in fact, is not a true loss as much as it is the appearance of the loss because the fibers are no longer as condensed or compressed as they had originally been immediately subsequent to transfer. The invention re-condenses the fibers, thus restoring the original vibrancy of the colors. Thus, the process of the invention can be used on an aged or previously used imaged receptor element such as fabric in order to restore the color of the original image.

The overlay sheet (e.g. silicone sheet) can be reused to infinity because nothing adheres to it. Therefore, after multiple washings have created the appearance of color loss, the color vibrancy can be regained by simply placing the silicone sheet over the imaged area aid repressing the fibers, thus condensing the fabric. The result will be a return to something very close to the original color. This process can be repeated and repeated after multiple washings and each time and vibrancy of the color will be regained.

The receptor element may be any desired receiver, such as textile, leather, ceramic, wool, glass, plastic or even metal having pores (i.e. metal sign). Preferably, the receptor element is a shirt, tee shirt or the like. Other suitable receptor surfaces include canvas, paper, or receptor supports used by the museum or conservatory industry. However, any receptor capable of receiving the imaging material (e g. image and non-image areas) of the transfer material or imaging sheet and imparting the desired washproof properties is within the scope of the invention.

Energy applied to the rear surface of the element is by heat and/or pressure via ironing with a hand held iron as opposed to a commercial hear press. The dry release transfer materials of the invention (as opposed to wet release materials) are preferably capable of receiving images from color laser copiers and/or printers. However, they are equally capable of receiving images from color ink jet printers or from black and white printers. Other commercially available copiers or printers that may image the transfer materials utilized in the present invention include thermal wax ribbon printers/copiers such as Seiko 5401, Sharp CX 5000 model color copier and Toshiba 5400 model. Panasonic, Fargo, Cal Comp and Mitsubishi also manufacture thermal ribbon printers and/or copiers which may be used.

As stated above, the invention is applicable to transfer paper currently utilized in laser printing. The most popular models and the ones typically used for fabric transfers are Canon Laser copiers 500, 600, 700 and 800 models.

The invention is further applicable to transfer paper currently utilized in ink jet printing. For instance, CANON has a well known Bubble Jet line of transfer products that may be utilized in their printers. Other manufacturers of Ink Jet copiers and/or printers include Hewlett-Packard, Epson, Xerox, Lexmark, Mannesman Tally and Hitachi.

Basically, any known or future developed copier or printer that is able to image a transfer material may be used.

Most preferably, the process of the invention takes place in the absence of steam.

Further, the process of the present invention operates in the pressure range that the typical user may apply by pressing with a conventional hand held iron present in virtually every household in the United States. The process of the invention preferably excludes pressures attainable with commercially available heat press equipment Indeed, with the advent of transfer materials for home use (i.e. where there are no commercial heat presses), the inventor observed a problem not previously known in the art and the solution thereto. That is, the problem addressed by the present inventor was a result of home use of transfer products and processes that presently are most successfully commercially conducted. In the absence of commercial equipment in the home, the inventor found the solution to the problem of incomplete transfer of the desired image. More specifically, the consumer was not able to provide enough pressure during the home transfer process as compared to the use of commercial heat press equipment, sometimes resulting in a less than perfect transfer. The present inventor overcame this problem.

One requirement of a suitable transfer coating of the invention is that it adhere strongly to fibrous supports, and optionally to glassy supports.

The transfer carrier layer in the transfer material used in the invention must also be capable of transfer from the support (e.g. imaging sheet) and adherence to a receptor support without the requirement of a separate surface adhesive layer. Without being bound by any theory, upon back surface heating of the support, the carrier would undergo a solid to solution phase transition resulting in a transfer to the receiving layer. Edge to edge adhesion, to the receiving layer, would occur upon cooling of the carrier onto the receiving layer. Upon cooling, an image layer would be completely transferred onto the receiving layer with an excess of carrier providing mechanical and thermal stability, as well as washability.

The transfer carrier layer of the transfer material should provide a colorfast image (e.g. washproof or wash resistant) when transferred to the receptor surface. That is, upon washing the receptor element (e.g. tee shirt), the image should remain intact on the receptor element.

Suitable transfer materials include the compositions from U.S. Pat. Nos. 5,501,902, 5,271,990 and 5,242,739. The contents of U.S. Pat. Nos. 5,501,902, 5,271,990 and 5,242,739 are herein incorporated by reference.

The present invention is most preferably directed to the use of dry transfer materials known in the art such as described in U.S. Pat. Nos. 5,501,902, 5,271,990 and 5,242,739. That is, dry release transfer materials per se are well known in the art, and any suitable dry release transfer material may be used in the invention. More specifically, the preferred dry release transfer materials of the present invention do not contain a water soluble material for wet release.

Canon creative products T-Shirt Transfers TR-101 may be used. Other suitable transfer materials include those described in U.S. Pat. Nos. 4,773,953 and 4,980,224 including a transfer sheet known as "TRANSEEZE" manufactured by Kimberly-Clark Corporation or any other commercially available transfer sheet which has a substrate with a coating which is transferable to a receptor sheet upon the application of heat or pressure to the back of the substrate, and that is coated with, for instance, Singapore Dammar Resin. The image-receptive heat transfer papers of U.S. Pat. Nos. 5,501,902, 5,271,990, and 5,242,739 may also be used. These papers generally have at least one film layer comprised of a thermoplastic polymer on a support. Also, Cycolor transfer materials as disclosed U.S. Pat. Nos. 5,139,917 and 5,236,801 and Provisional Application Ser. No. 60/030,933 filed Nov. 15, 1996, entitled "Imaging Transfer System and Process for Transferring Image and Non-Image Areas Thereof to Receptor Element" to Donald S. Hare may be used, or silver halide transfer materials as disclosed in copending applications U.S. Ser. Nos. 08/659,700 and 08/479,409 and Provisional Application Ser. No. 60/029,917 filed Nov. 4, 1996, entitled "Silver Halide Photographic Material and Method of Applying a Photographic Image to a Receptor Element" to Donald S. Hare and Scott A. Williams may be used. Common among all of these transfer materials is a carrier material which is capable of both dry release and adhesion.

Suitable dry release transfer materials may comprise (i) any known suitable support in the field of transfer materials (i.e. paper, plastic coated papers, PET resins, etc.), and (ii) coated on the support a release/transfer material (e.g. carrier) that is capable of receiving an image thereon (i.e. via photocopying or printing) such as Singapore Dammar resin, Batavia Dammar resin, accroide (yucca) resin, East India resins, Kauri resins, Manila resins, pontianak, and acrylics.

The invention is preferably applicable to printers or copiers that can handle a transfer sheet. That is, the invention is applicable to use in, for instance, ink jet printers and copiers, thermal wax ribbon printers and copiers, laser toner copiers, Canon color laser copiers, etc. Whenever the transfer is used and it is necessary to drive the transfer image into the valleys of the receptor sheet, the process of the present invention should be used. The process of the invention fills the valleys of the receptor element, thereby filling the voids left by the initial transfer. This additional heating step prevents cracking of the transferred image and improved launderability. By using a second heat step with a second sheet (i.e. commercially available silicone paper, that is generally softer and less rigid than, for instance, the original paper backing of the original transfer material, the image is transferred into the receptor element (i.e. textile) providing the final product with a more compliant feel. The process of the invention should not is be used with copiers/printers that overheat the transfer material (i.e. heating above the melting point of the transfer carrier) during the imaging stage.

Another embodiment of the invention relates to cold peel, as follows:

1. A base paper for the coatings.
2. The inside of the base paper, that which will be in contact with the coatings, must be of an easy release such as silicone. This will allow for easy peeling of support sheet (i.e. silicone) from coatings before ironing of transfer.
3. After the coatings, with support sheet have passed through the copier, the silicone support is peeled from the coatings.
4. The coatings, now appearing as a "film" rather than a full bodied transfer, are placed into position atop the fabric.
5. A silicone sheet is then placed directly over the coatings (film).
6. Set the iron to "hottest" and press the coatings, protected by the silicone sheet, into the fabric. The "ironer" can press as firmly and for as long as he/she chooses, in each position. Recommend 20 seconds at each of 8 positions.
7. After last position has been pressed, one or two passes should be made over the entire surface to press down the areas in the surface of the iron where the steam holes are located.

An easy and complete peel of paper will result.

The cause for the ease and totality of the paper release is the result of the coatings first having been removed from the support sheet which had to have been thicker, more steady, and a restriction of heat permeability to carry the coatings then the printing process.

Once the coatings were removed from this support sheet, a silicone (thin sheet placed over this film) one could iron for a full 20 seconds, (or longer if needed), the surface circled with the iron after the pressing. It makes no difference if the first positions have cooled, because it is desirable for the entire surface to cool. The silicone sheet, used to protect coatings from surface of iron, release easily and completely from coatings when cold. This is in contrast from transfers in existence today which must be peeled hot. This is impossible to do with a hand iron because first positions of iron will have cooled by time last position has been pressed.

Methods of transferring an image to a receptor element are also disclosed in the above-mentioned patents. That is, the transfer materials per se utilized in the present invention are known in the art, as are methods for transferring the images to the receptor element using a single heat transfer step.

The amount of time needed to press the non-stick, non-tacky sheet with a hand iron in order to press the transfer coating into valleys of the receptor element varies depending on the success of the initial transfer and the temperature of the iron. The amount of time for repress is that which is necessary to drive the coating into the receptor element or alternatively to condense the fibers to restore color vibrancy. For example, the time that the iron is placed over a specific area that the iron covers may be anywhere from 5 seconds to 90 seconds, preferably from 8 seconds to 60 seconds, and more preferably from 15 to 30 seconds per position. The iron may be repositioned in consecutive order until the area that the transfer covers has been pressed in its entirety.

The invention is applicable to the following transfer materials. However, the invention is not limited to the following transfer materials.

Image Receptive Heat Transfer Papers of U.S. Pat. No. 5,271,990

The process of the present invention is further applicable to the image receptive heat transfer materials of U.S. Pat. No. 5,271,990. For instance, the present invention also relates to a method of transferring image and non-image areas to a receptor element which comprises the steps of:

(a) placing an image on an image-receptive heat transfer material (i.e., by thermal ribbon printers, impact ribbon printers, dot matrix printers, crayons, printing or copying with a photocopier) which comprises:
   a flexible cellulosic nonwoven web base sheet having top and bottom surfaces,
   an image-receptive melt-transfer film layer overlaying the top surface of said base sheet, which image-receptive melt-transfer film layer is comprised of a thermoplastic polymer selected from the group consisting of polyolefins, polyesters, and ethylenevinyl acetate copolymers and which melts in the range of from about 65 to about 180 degrees Celsius, in which the exposed surface of said image-receptive melt-transfer layer has a smoothness value, independent of the smoothness of the base sheet, of at least about 10 cc/minute as measured by a Sheffield Smoothness Tester, (b) positioning the top or front surface of the transfer material having the image thereon against a receptor element, (c) applying heat to the rear or bottom surface of the transfer material having the image thereon to transfer the image and non-image area to the receptor element, (d) peeling away the support to obtain an imaged receptor element such as a fabric, (e) placing a non-stick or tack free overlay sheet (e.g. thin silicone sheet) over the imaged receptor element such as a fabric, and (f) pressing the overlay sheet (e.g. silicone sheet) by hand ironing to drive the coating into the fabric and removing the overlay sheet.

The present invention also relates to a method of transferring image and non-image areas to a receptor element which comprises the steps of:

(a) placing an image on an image-receptive heat transfer material (e.g. by thermal ribbon printers, impact ribbon printers, laser printers, dot matrix printers, crayons, or copying with a photocopier), which comprises:
   a flexible cellulosic nonwoven web base sheet having top and bottom surfaces,
   a melt extruded, melt-transfer film layer overlaying the top surface of said base sheet, which melt transfer film layer is comprised of a first thermoplastic polymer selected from the group consisting of polyolefins, polyesters, and ethylene-vinyl acetate copolymers, ethylene-methacrylic acid copolymers, and ethylene-acrylic acid copolymers and which melts in the range of from about 65 to about 180 degrees Celsius, and a melt-extruded, image receptive film layer overlaying said melt-transfer layer, which image-receptive film layer is comprised of a second thermoplastic polymer selected from the group consisting of polyolefins, polyesters, and ethylene-vinyl acetate copolymers and which melts in the range of from about 65 to about 180 degrees Celsius, in which the exposed surface of said image-receptive film layer has a smoothness value, independent of the smoothness of the base sheet, of at least about 10 cc/minute as measured by a Sheffield Smoothness Tester, (b) positioning the top or front surface of the transfer material having the image thereon against a receptor element, (c) applying heat to the rear or bottom surface of the transfer material having the image thereon to transfer the image and non-image area to the receptor element, (d) peeling away the support to obtain an imaged receptor element such as a fabric, (e) placing a non-stick or tack-free overlay sheet (e.g. thin silicone sheet) over the imaged receptor element such as a fabric, and (f) pressing the overlay sheet (e.g. silicone sheet) by hand ironing to drive the coating into the fabric and removing the overlay sheet.

Image Receptive Heat Transfer Papers of U.S. Pat. No. 5,242,739

The process of the present invention is further applicable to the image receptive heat transfer materials of U.S. Pat. No. 5,242,739. For instance, the present invention also relates to a method of transferring image and non-image areas to a receptor element which comprises the steps of:

(a) placing an image on an image-receptive heat transfer material (e.g. by thermal ribbon printers, impact ribbon printers, laser printers, dot matrix printers, crayons, or copying with a photocopier), which comprises:
a flexible cellulosic nonwoven web base sheet having top and bottom surfaces,
an image-receptive melt-transfer film layer overlaying the top surface of said base sheet, which image-receptive melt-transfer film layer comprises about 15 to about 80 percent by weight of a film-forming binder selected from the group consisting of ethyleneacrylic acid copolymers, polyolefins, and waxes and from about 85 to about 20 percent by weight of a powdered thermoplastic polymer selected from the group consisting of polyolefins, polyesters, polyamides, waxes, epoxy polymers, ethylene-acrylic acid copolymers, and ethylene-vinyl acetate copolymers, wherein each of said film-forming binder and said powdered thermoplastic polymer melts in the range of from about 65° C. to about 180 degrees Celsius and said powdered thermoplastic polymer consists of particles which are from about 2 to about 50 micrometers in diameter, (b) positioning the top or front surface of the transfer material having the image thereon against a receptor element, (c) applying heat to the rear or bottom surface of the transfer material having the image thereon to transfer the image and non-image area to the receptor element, (d) peeling away the support to obtain an imaged receptor element such as a fabric, (e) placing a non-stick or tack-free overlay sheet (e.g. thin silicone sheet) over the imaged receptor element such as a fabric, and (f) pressing the overlay sheet (e.g. silicone sheet) by hand ironing to drive the coating into the fabric and removing the overlay sheet.

The present invention also relates to a method of transferring image and non-image areas to a receptor element which comprises the steps-of:

(a) placing an image on an image-receptive heat transfer paper (e.g. by thermal ribbon printers, impact ribbon printers, laser printers, dot matrix printers, crayons, or copying with a photocopier), which comprises:
a flexible cellulosic nonwoven web base sheet having top and bottom surfaces,
a melt transfer film layer overlaying the top surface of said base sheet, which melt transfer film layer comprises a film forming binder selected from the group consisting of ethylene-acrylic acid copolymers, polyolefins, and waxes and which melts in the range of from about 65 to about 180 degrees Celsius, and
an image-receptive film layer overlaying said melt-transfer film layer, which image-receptive film layer comprises about 15 to about 80 percent by weight of a film-forming binder selected from the group consisting of ethylene-acrylic acid copolymers, polyolefins, and waxes and from about 85 to about 20 percent by weight of a powdered thermoplastic polymer selected from the group consisting of polyolefins, polyesters, polyamides, waxes, epoxy polymers, ethylene-acrylic acid copolymers, and ethylene-vinyl acetate copolymers, wherein each of said film-forming binder and said powdered thermoplastic polymer melts in the range of from about 65° C. to about 180 degrees Celsius and said powdered thermoplastic polymer consists of particles which are from about 2 to about 50 micrometers in diameter, (b) positioning the top or front surface of the transfer material having the image thereon against a receptor element, (c) applying heat to the rear or bottom surface of the transfer material having the image thereon to transfer the image and non-image area to the receptor element, (d) peeling away the support to obtain an imaged receptor element such as a fabric, (e) placing a non-stick or tack-free overlay sheet (e.g. thin silicone sheet) over the imaged fabric, and (f) pressing the overlay sheet (e.g. silicone sheet) by hand ironing to drive the coating into the fabric and removing the overlay sheet.

Image Receptive Heat Transfer Papers of U.S. Pat. No. 5,501,902

The process of the present invention is further applicable to the image receptive heat transfer materials of U.S. Pat. No. 5,501,902. For instance, the present invention also relates to a method of transferring image and non-image areas to a receptor element which comprises the steps of:

(a) placing an image on an image-receptive heat transfer material having first and second surfaces (e.g. by laser printers, ink jet printers, dot-matrix printers, silk screening, direct and offset gravure printers, and photocopying), which comprises:
a first layer defining the first surface, said first layer having a front and rear surface, and
a second layer defining the second surface, which layer comprises particles of a thermoplastic polymer having largest dimensions of less than about 50 micrometers, from about 10 to about 50 weight percent of a film-forming binder, based on the weight of the thermoplastic polymer, and from about 0.2 to about 10 weight percent of an ink viscosity modifier, based on the weight of the thermoplastic polymer, (b) positioning the second layer of the transfer material having the image thereon against a receptor element, (c) applying heat to a rear surface of the transfer material having the image thereon to transfer the image and non-image area to the receptor element, (d) peeling away the support to obtain an imaged receptor element such as a fabric, (e) placing a non-stick or tack-free overlay sheet (e.g. thin silicone sheet) over the imaged receptor element such as a fabric, and (f) pressing the overlay sheet (e.g. silicone sheet) by hand ironing to drive the coating into the fabric and removing the overlay sheet.

The present invention also relates to a method of transferring image and non-image areas to a receptor element which comprises the steps of:

(a) placing an image on an image-receptive heat transfer material having a front and rear surface (e.g. by laser printers, ink jet printers, dot-matrix printers, silk screening, direct and offset gravure printers, and photocopying), which comprises:

a first layer having first and second surfaces and selected from the group consisting of films and cellulosic nonwoven webs; and a second layer which is receptive to ink jet ink overlaying the first surface of the first layer, which second layer melts from about 65 to about 180° C. and comprises particles of a thermoplastic polymer having largest dimensions of less than about 50 micrometers, from about 10 to about 50 weight percent of a film-forming binder, based on the thermoplastic polymer, and from about 2 to about 20 weight percent of a cationic polymer, based on the weight of the thermoplastic polymer, (b) positioning the second layer of the transfer material having the image thereon against a receptor element, (c) applying heat to the rear surface of the transfer material having the image thereon to transfer the image and non-image area to the receptor element, (d) peeling away the support to obtain an imaged receptor element such as a fabric, (e) placing a non-stick or tack-free overlay sheet (e.g. thin silicone sheet) over the imaged receptor element such as a fabric, and (f) pressing the overlay sheet (e.g. silicone sheet) by hand ironing to drive the coating into the fabric and removing the overlay sheet.

The present invention also relates to a method of transferring image and non-image areas to a receptor element which comprises the steps of:

(a) placing an image on an image-receptive heat transfer material having a front and rear surface (e.g. by laser printers, ink jet printers, dot-matrix printers, silk screening, direct and offset gravure printers, and photocopying), which comprises:

a first layer having first and second surfaces and selected from the group consisting of films and cellulosic nonwoven webs; and a third layer overlaying the first surface of the first layer; and a second layer which is receptive to ink jet ink overlaying the second layer, which second layer melts from about 65 to about 180° C. and comprises particles of a thermoplastic polymer having largest dimensions of less than about 50 micrometers, from about 10 to about 50 weight percent of a film-forming binder, based on the thermoplastic polymer, and from about 2 to about 20 weight percent of a cationic polymer, based on the weight of the thermoplastic polymer, (b) positioning the second layer of the transfer material having the image thereon against a receptor element, (c) applying heat to the rear surface of the transfer material having the image thereon to transfer the image and non-image area to the receptor element, (d) peeling away the support to obtain an imaged receptor element such as a fabric, (e) placing a non-stick or tack-free overlay sheet (e.g. thin silicone sheet) over the imaged receptor element such as a fabric, and (g) pressing the overlay sheet (e.g. silicone sheet) by hand ironing to drive the coating into the fabric and removing the overlay sheet.

Cycolor Transfer Materials

The process of the invention is applicable to Cycolor transfer materials of U.S. Pat. Nos. 5,139,917 and 5,236,801.

A representative imaging sheet that may be used in the invention is the imaging sheet of U.S. Pat. No. 5,139,917. This imaging sheet is set forth in FIG. 1 and is generally represented by reference numeral 10. The imaging sheet 10 includes a support 12 having a transfer coating layer 120 and a photosensitive layer 14 on one surface thereof. The layer 14 includes photosensitive microcapsules 16 and a developer resin (e.g., phenolic) 18. The microcapsules 16 and developer resin 18 do not need to be coated in the same layer, but can be coated in contiguous layers with the microcapsules underlying or overlying a layer of the developer resin. The support 12 may be a polymeric film. If the support 12 is transparent, the imaging sheet can be exposed from either surface. The developer layer 18 is not necessarily a film but may consist of finely divided dispersion particles. Similarly, developer layer 18 is not necessarily contiguous but may be interrupted by pores or capillaries.

Accordingly, the present invention also relates to a method of transferring image and non-image areas to a receptor element which comprises the steps of:

(a) exposing image-wise an imaging system, which comprises:

a support having a front and rear surface, a transfer coating on said front surface of the support comprising a material capable of holding developed image and non-image areas that can be transferred to a receptor surface upon the application of heat to the rear surface of the support, said transfer coating layer capable of stripping from said front surface of the support and adhering to said receptor surface by liquefying and releasing from said support when heated and resolidifying within and around fibers of said receptor surface when heat is removed, said resolidified liquid seals the transferred image and non-image areas to the receptor surface rendering the transferred image washproof or wash resistant, and a layer of microcapsules on said transfer coating, (b) developing the image-wise exposed element to form an image, (c) positioning the front surface of the developed element or positioning the undeveloped element prior to development against a receptor element, said developed element or undeveloped element containing the transfer layer of the invention, (d) applying heat to the rear surface of the developed or undeveloped element to transfer the developed image and non-image area to the receptor element, (e) peeling away the support to obtain an imaged receptor element such as a fabric, (f) placing a non-stick or tack-free overlay sheet (e.g. thin silicone sheet) over the imaged receptor element such as a fabric, and (g) pressing the non-stick or tack-free overlay sheet (e.g. silicone sheet) by hand ironing to drive the coating into the fabric and removing the overlay sheet.

The present invention also relates to a method of transferring image and non-image areas to a receptor element which comprises the steps of:

(a) exposing image-wise an imaging system, comprising (i) an imaging sheet and developer material carried on said imaging sheet, or (ii) an imaging sheet and a developer carried on a separate developer sheet, the imaging sheet having a layer of an encapsulated radiation curable photosensitive composition, said imaging system capable of forming images by image-wise exposing said imaging sheet to radiation actinic with respect to said photosensitive composition, and rupturing or dissolving capsules in the presence of said developer material to form an image, wherein a transfer coating on a front surface of a support of the imaging sheet, developer sheet or both comprising a material capable of holding developed image and non-image areas that can be transferred to a receptor surface upon the application of heat to the rear surface of the support, said transfer coating layer capable of stripping from said front surface of the support and adhering to said receptor surface by liquefying and releasing from said support when heated and resolidifying within and around fibers of said receptor surface when heat is removed, said resolidified liquid coating seals the transferred image and non-image areas to the receptor surface rendering the transferred image washproof or wash resistant, (b) developing the image-wise exposed element to form an image, (c) positioning the front surface of the developed element or positioning the undeveloped element prior to development against a receptor element, said developed element or undeveloped element containing the transfer layer of the invention, and (d) applying heat to the rear surface of the developed or undeveloped element to transfer the developed image and non-image area to the receptor element, (e) peeling away the support to obtain an imaged receptor element such as a fabric, (f) placing a non-stick or tack-free overlay sheet (e.g. thin silicone sheet) over the imaged receptor element such as a fabric, and (g) pressing the non-stick or tack-free overlay sheet (e.g. silicone sheet) by hand ironing to drive the coating into the fabric and removing the overlay sheet.

The present invention also relates to a method of transferring image and non-image areas to a receptor element which comprises the steps of:

(a) exposing image-wise a transfer imaging system in which images are formed by image-wise reaction of one or more chromogenic materials and a developer, said system comprising, an imaging sheet comprising a first substrate, a radiation curable composition which undergoes an increase in viscosity upon exposure to actinic radiation, a coating on one surface of said first substrate comprising said chromogenic material and said radiation curable composition, said radiation curable composition being encapsulated in rupturable capsules as an internal phase, and a developer sheet comprising a second substrate having a front and rear surface, a transfer coating on said front surface of the second substrate comprising a material capable of holding developed image and non-image areas that can be transferred to a receptor surface upon the application of heat to the rear surface of the support, said transfer coating layer capable of stripping from said front surface of the support and adhering to said receptor surface by liquefying and releasing from said support when heated and resolidifying within and around fibers of said receptor surface when heat is removed, said resolidified liquid coating seals the transferred image and non-image areas to the receptor surface rendering the transferred image washproof or wash resistant, and a developer material on said transfer coating capable of reacting with said chromogenic material to form an image on the surface of said second substrate, wherein images are formed by image-wise exposing said coating to actinic radiation, and rupturing capsules in the image areas with said coating in facial contact with said developer sheet such that said internal phase is image-wise released from said ruptured capsules and there is image-wise transfer of said chromogenic material to said developer sheet and a patterned image-forming reaction occurs between said chromogenic material and said developer material, (b) developing the image-wise exposed element to form an image, (c) positioning the front surface of the developed element or positioning the undeveloped element prior to development against a receptor element, said developed element or undeveloped element containing the transfer layer of the invention, (d) applying heat to the rear surface of the developed or undeveloped element to transfer the developed image and non-image area to the receptor element, (e) peeling away the support to obtain an imaged receptor element such as a fabric, (f) placing a non-stick or tack-free overlay sheet (e.g. thin silicone sheet) over the imaged receptor element such as a fabric, and (g) pressing the non-stick or tack-free overlay sheet (e.g. silicone sheet) by hand ironing to drive the coating into the fabric and removing the overlay sheet.

The present invention also relates to a method of transferring image and non-image areas to a receptor element which comprises the steps of:

(a) exposing image-wise a transfer imaging system in which images are formed by image-wise reaction of one or more chromogenic materials and a developer, said system comprising, an imaging sheet comprising a first substrate,
a chromogenic material,
a photodepolymerizable composition which undergoes a decrease in viscosity upon exposure to actinic radiation,
a coating on one surface of said first substrate comprising said chromogenic material and said photodepolymerizable composition,
said photodepolymerizable composition being encapsulated in rupturable capsules as an internal phase, and
a developer sheet comprising a second substrate having a front and rear surface,
a transfer coating on said front surface of the second substrate comprising a material capable of holding developed image and non-image areas that can be transferred to a receptor surface upon the application of heat to the rear surface of the support, said transfer coating layer capable of stripping from said front surface of the support and adhering to said receptor surface by liquefying and releasing from said support when heated and resolidifying within and around fibers of said receptor surface when heat is removed, said resolidified liquid coating seals the transferred image and non-image areas to the receptor surface rendering the transferred image washproof or wash resistant, and
a developer material on said transfer coating capable of reacting with said chromogenic material to form an image on the surface of said second substrate,
wherein images are formed by image-wise exposing said coating to actinic radiation, and rupturing capsules in the image areas with said coating in facial contact with said developer sheet such that said internal phase is image-wise released from said ruptured capsules and there is image-wise transfer of said chromogenic material to said developer sheet and a patterned image-forming reaction occurs between said chromogenic material and said developer material, (b) developing the image-wise exposed element to form an image, (c) positioning the front surface of the developed element or positioning the undeveloped element prior to development against a receptor element, said developed element or undeveloped element containing the transfer layer of the invention, (d) applying heat to the rear surface of the developed or undeveloped element: to transfer the developed image and non-image area to the receptor element, (e) peeling away the support to obtain an imaged receptor element such as a fabric, (f) placing a non-stick or tack-free overlay sheet (e.g. thin silicone sheet) over the imaged receptor element such as a fabric, and (g) pressing the non-stick or tack-free overlay sheet (e.g. silicone sheet) by hand ironing to drive the coating into the fabric and removing the overlay sheet.

The present invention also relates to a method of transferring image and non-image areas to a receptor element which comprises the steps of:

(a) exposing image-wise an imaging material comprising a support having a front and rear surface, a transfer coating on said front surface of the support comprising a material capable of holding developed image and non-image areas that can be transferred to a receptor surface upon the application of heat to the rear surface of the support, said transfer coating layer capable of stripping from said front surface of the support and adhering to said receptor surface by liquefying and releasing from said support when heated and resolidifying within and around fibers of said receptor surface when heat is removed, said resolidified liquid coating seals the transferred image and non-image areas to the receptor surface rendering the transferred image washproof or wash resistant, and a layer of photosensitive microparticles on one surface of said support, said microparticles including an image-forming agent and a photosensitive composition containing a polymer which is capable of undergoing cationically initiated depolymerization and photoinitiator including a silver halide and an organo silver salt, wherein, after exposing said microparticle to radiation, said microparticles, directly or with additional processing, release said image-forming agent or become permeable to a developer which reacts with said image-forming agent to form a visible image, (b) developing the image-wise exposed element to form an image, (c) positioning the front surface of the developed element or positioning the undeveloped element prior to development against a receptor element, said developed element or undeveloped element containing the transfer layer of the invention, (d) applying heat to the rear surface of the developed or undeveloped element to transfer the developed image and non-image area to the receptor element, (e) peeling away the support to obtain an imaged receptor element such as a fabric, (f) placing a non-stick or tack-free overlay sheet (e.g. thin silicone sheet) over the imaged receptor element such as a fabric, and (g) pressing the non-stick or tack-free overlay sheet (e.g. silicone sheet) by hand ironing to drive the coating into the fabric and removing the overlay sheet.

The present invention also relates to a method of transferring image and non-image areas to a receptor element which comprises the steps of:

(a) exposing image-wise a color imaging system comprising:
an imaging sheet having a front and rear surface,
a transfer coating on said front surface of the imaging sheet comprising a material capable of holding developed image and non-image areas that can be transferred to a receptor surface upon the application of heat to the rear surface of the imaging sheet, said transfer coating layer capable of stripping from said front surface of the support and adhering to said receptor surface by liquefying and releasing from said support when heated and resolidifying within and around fibers of said receptor surface when heat is removed, said resolidified liquid coating seals the transferred image and non-image areas to the receptor surface rendering the transferred image washproof or wash resistant, and dry developer material carried on said imaging sheet, or
an imaging sheet, a separate image receiving developer sheet having a front and rear surface and having said transfer coating and a dry developer material on said front surface,
said imaging sheet having on one surface thereof a coating and a dry developer material on said front surface, said imaging sheet having on one surface thereof a coating comprising a cyan color precursor, a radiation curable photosensitive composition associated with said cyan color precursor, a magenta color precursor, a radiation curable photosensitive composition associated with said magenta color precursor, a yellow color precursor, and a radiation curable photosensitive composition associated with said yellow color precursor, said radiation curable photosensitive compositions having distinct sensitivities and being encapsulated in pressure rupturable capsules as an internal phase, said capsules having discrete capsule walls, said cyan, magenta and yellow color precursors being soluble in said associated photosensitive compositions or solvents for said color precursors being encapsulated with said associated photosensitive compositions and said color precursors being present in said capsules with said photosensitive compositions or in said discrete walls;

said imaging system being capable of forming images by image-wise exposing said imaging sheet to radiation actinic with respect to said photosensitive compositions, and rupturing at least said capsules containing photosensitive compositions unexposed by said actinic radiation in the presence of said developer material to form an image by reaction of said color precursors with said developer material, (b) developing the image-wise exposed element to form an image, (c) positioning the front surface of the developed element or positioning the undeveloped element prior to development against a receptor element, said developed element or undeveloped element containing the transfer layer of the invention, (d) applying heat to the rear surface of the developed or undeveloped element to transfer the developed image and non-image area to the receptor element, (e) peeling away the support to obtain an imaged receptor element such as a fabric, (f) placing a non-stick or tack-free overlay sheet (e.g. thin silicone sheet) over the imaged receptor sheet such as a fabric, and (g) pressing the non-stick or tack-free overlay sheet (e.g. silicone sheet) by hand ironing to drive the coating into the fabric and removing the overlay sheet.

The process of the invention is applicable to Cycolor transfer material of Provisional Application No. 60/030,933, filed on Nov. 15, 1996, entitled "Imaging Transfer System and Process for Transferring Image and Non-Image Areas Thereof to a Receptor Element," to Donald S. Hare. The present invention thus also relates to a method of transferring image and non-image areas to a receptor element which comprises the steps of:

(a) exposing image-wise an imaging system, which comprises:

a support having a front and rear surface, at least one layer of microcapsules or at least one layer of microcapsules and developer in the same layer or at least one layer of microcapsules and developer in separate layers, on said front surface of the support, wherein the microcapsules or developer or microcapsules and developer are dispersed in a carrier which is capable of transferring and adhering developed image and non-image areas from said front surface of said support upon the application of heat energy to the rear surface of the support, said carrier strips from said front surface of the support by liquefying and releasing from said support when heated, said liquefied carrier providing adherence to a receptor element by flowing onto said receptor element and solidifying thereon, said adherence does not require an external adhesive layer, with the proviso that the carrier is not capable of reacting to form an image, and when the microcapsules are present together in the same layer as the carrier, the carrier has a particle size which is the same as or smaller than that of the microcapsules, and an optional protective layer of clear thermoplastic, (b) developing the image-wise exposed element to form an image, (c) positioning the front surface of the developed element or positioning the undeveloped element prior to development against a receptor element, said developed element or undeveloped element containing the transfer layer of the invention, (d) applying heat to the rear surface of the developed or undeveloped element to transfer the developed image and non-image area to the receptor element, (e) peeling away the support to obtain an imaged receptor element such as a fabric, (f) placing a non-stick or tack-free overlay sheet (e.g. thin silicone sheet) over the imaged receptor element such as a fabric, and (g) pressing the non-stick or tack-free overlay sheet (e.g. silicone sheet) by hand ironing to drive the coating into the fabric and removing the overlay sheet.

The present invention also relates to a method of transferring image and non-image areas to a receptor element which comprises the steps of:

(a) exposing image-wise an imaging system, which comprises:

a support having a front and rear surface, at least one layer of microcapsules on said front surface of the support, wherein the microcapsules are dispersed in a carrier which is capable of transferring and adhering developed image and non-image areas from said front surface of said support upon the application of heat energy to the rear surface of the support, said carrier strips from said front surface of the support by liquefying and releasing from said support when heated, said liquefied carrier providing adherence to a receptor element by flowing onto said receptor element and solidifying thereon, said adherence does not require an external adhesive layer, with the proviso that the carrier is not capable of reacting to form an image, and when the microcapsules are present together in the same layer as the carrier, the carrier has a particle size which is the same as or smaller than that of the microcapsules, and an optional protective layer of clear thermoplastic, (b) developing the image-wise exposed element to form an image, (c) positioning the front surface of the developed element or positioning the undeveloped element prior to development against a receptor element, said developed element or undeveloped element containing the transfer layer of the invention, (d) applying heat to the rear surface of the developed or undeveloped element to transfer the developed image and non-image area to the receptor element, (e) peeling away the support to obtain an imaged receptor element such as a fabric, (f) placing a non-stick or tack-free overlay sheet (e.g. thin silicone sheet) over the imaged receptor element such as a fabric, and (g) pressing the non-stick or tack-free overlay sheet (e.g. silicone sheet) by hand ironing to drive the coating into the fabric and removing the overlay sheet.

The present invention also relates to a method of transferring image and non-image areas to a receptor element which comprises the steps of:

(a) exposing image-wise an imaging system, which comprises:
a support having a front and rear surface,
at least one layer of microcapsules and developer in the same layer on said front surface of the support, wherein the microcapsules and developer are dispersed in a carrier which is capable of transferring and adhering developed image and non-image areas from said front surface of said support upon the application of heat energy to the rear surface of the support, said carrier strips from said front surface of the support by liquefying and releasing from said support when heated, said liquefied carrier providing adherence to a receptor element by flowing onto said receptor element and solidifying thereon, said adherence does not require an external adhesive layer, with the proviso that the carrier is not capable of reacting to form an image, and when the microcapsules are present together in the same layer as the carrier, the carrier has a particle size which is the same or smaller than that of the microcapsules,
an optional protective layer of clear thermoplastic, (b) developing the image-wise exposed element to form an image, (c) positioning the front surface of the developed element or positioning the undeveloped element prior to development against a receptor element, said developed element or undeveloped element containing the transfer layer of the invention, (d) applying heat to the rear surface of the developed or undeveloped element to transfer the developed image and non-image area to the receptor element, (e) peeling away the support to obtain an imaged receptor element such as a fabric, (f) placing a non-stick or tack-free overlay sheet (e.g. thin silicone sheet) over the imaged receptor element such as a fabric, and (g) pressing the overlay sheet (e.g. silicone sheet) by hand ironing to drive the coating into the fabric and removing the overlay sheet.

The present invention also relates to a method of transferring image and non-image areas to a receptor element which comprises the steps of:

(a) exposing image-wise an imaging system comprising (i) an imaging sheet and developer material carried on said imaging sheet, or (ii) an imaging sheet and a developer carried on a separate developer sheet, the imaging sheet having a layer of an encapsulated radiation curable photosensitive composition, said imaging system capable of forming images by image-wise exposing said imaging sheet to radiation actinic with respect to said photosensitive composition, and rupturing or dissolving capsules in the presence of said developer material to form an image, wherein at least one layer of microcapsules or at least one layer of microcapsules and developer in the same layer, or at least one layer of microcapsules and developer in separate layers, on said front surface of the support, wherein the microcapsules or developer or microcapsules and developer are dispersed in a carrier which is capable of transferring and adhering developed image and non-image areas from said front surface of said support upon the application of heat energy to the rear surface of the support, said carrier strips from said front surface of the support by liquefying and releasing from said support when heated, said liquefied carrier providing adherence to a receptor element by flowing onto said receptor element and solidifying thereon, said adherence does not require an external adhesive layer, with the proviso that the carrier is not capable of reacting to form an image, and when the microcapsules are present together in the same-layer as the carrier, the carrier has a particle size which is the same as or smaller than that of the microcapsules, (b) developing the image-wise exposed element to form an image, (c) positioning the front surface of the developed element or positioning the undeveloped element prior to development against a receptor element, said developed element or undeveloped element containing the transfer layer of the invention, (d) applying heat to the rear surface of the developed or undeveloped element to transfer the developed image and non-image area to the receptor element, (e) peeling away the support to obtain an imaged receptor element such as a fabric, (f) placing a non-stick or tack-free overlay sheet (e.g. thin silicone sheet) over the imaged receptor element such as a fabric, and (g) pressing the overlay sheet (e.g. silicone sheet) by hand ironing to drive the coating into the fabric and removing the overlay sheet.

The present invention also relates to a method of transferring image and non-image areas to a receptor element which comprises the steps of:

(a) exposing image-wise an imaging material comprising a support having a front and rear surface, and a layer of photosensitive microparticles on one surface of said support, wherein the microparticles are dispersed in a carrier which is capable of transferring and adhering developed image and non-image areas from said front surface of said support upon the application of heat energy to the rear surface of the support, said carrier strips from said front surface of the support by liquefying and releasing from said support when heated, said liquefied carrier providing adherence to a receptor element by flowing onto said receptor element and solidifying thereon, said adherence does not require an external adhesive layer, with the proviso that the carrier is not capable of reacting to form an image, and when the microcapsules are present together in the same layer as the carrier, the carrier has a particle size which is the same as or smaller than that of the microcapsules, said microparticles including an image-forming agent and a photosensitive composition containing a polymer which is capable of undergoing cationically-initiated depolymerization and photoinitiator including a silver halide and an organo silver salt, wherein, after exposing said microparticle to radiation, said microparticles, directly or with additional processing, release said image-forming agent or become permeable to a developer which reacts with said image-forming agent to form a visible image, (b) developing the image-wise exposed element to form an image, (c) positioning the front surface of the developed element or positioning the undeveloped element prior to development against a receptor element, said developed element or undeveloped element containing the transfer layer of the invention, (d) applying heat to the rear surface of the developed or undeveloped element to transfer the developed image and non-image area to the receptor element, (e) peeling away the support to obtain an imaged receptor element such as a fabric, (f) placing a non-stick or tack-free overlay sheet (e.g. thin silicone sheet) over the imaged fabric, and (g) pressing the overlay sheet (e.g. silicone sheet) by hand ironing to drive the coating into the fabric and removing the overlay sheet.

The imaged transfer material also encompasses the imaged developer or receiver sheet as defined in U.S. Pat. No. 5,236,801 and the above-mentioned Provisional Application to Donald S. Hare filed on Nov. 15, 1996. The present invention also relates to a method of applying an image to a receptor element, which comprises the steps of:

(a) exposing imagewise an imaging system which comprises, a support having a front and rear surface, at least one layer of (e.g. photosensitive or thermal-sensitive) microcapsules, or at least one layer of (e.g. photosensitive or thermal-sensitive) microcapsules and developer in the same layer, or at least one layer of (e.g. photosensitive or thermal-sensitive) microcapsules and developer in separate layers, on said front surface of the support, wherein said microcapsules, or developer or both are dispersed in the carrier of the invention, said carrier preferably having a melting point of at least 100° C., and which is capable of transferring and adhering developed image and non-image areas from said front surface of said support upon the application of heat energy to the rear surface of the support, said carrier strips from said front surface of the support by liquefying and releasing from said support when heated, said liquefied carrier providing adherence to a receptor element by flowing onto said receptor element and solidifying thereon, said adherence does not require an external (e.g. surface) adhesive layer and preferably occurs in an area at least coextensive with the area of said microcapsules, with the proviso that the carrier is not capable of reacting (e.g. with a color precursor) to form an image, and an optional layer of clear thermoplastic material (i.e. preferably, the particle size of the carrier is the same as or smaller than that of the microcapsules, for example, from 1-20 micrometers), (b) developing the imagewise exposed element to form an image, (c) positioning the front surface of said developed element (or positioning the undeveloped element prior to development) against said receptor element, (d) applying energy (e.g heat) to the rear surface of the element to transfer the developed image and nonimage area to said receptor element, (e) peeling away the support to obtain an imaged receptor element such as a fabric, (f) placing a non-stick or tack;-free overlay sheet (e.g. thin silicone sheet) over the imaged receptor element such as a fabric, and (g) pressing the overlay sheet (e.g. silicone sheet) by hand ironing to drive the coating into the fabric and removing the overlay sheet.

Transfer Material Containing Energy Sensitive Resin of U.S. Pat. 4,980,224

The invention is further applicable to the transfer sheet of U.S. Pat. No. 4,980,224. Thus, the present invention further relates to a method of applying an image to a receptor element, which comprises the steps of:

(a) generating an image on an obverse surface of a transfer sheet, said transfer sheet including a substrate, a first coating on said substrate of material transferable from said substrate to a receptor surface by the application of heat or pressure thereto, and a second coating on said first coating, said second coating consisting essentially of a mixture of Singapore Dammar resin and abrasive particles to form an abrasive surface for increasing the receptivity of the transfer sheet;

(b) positioning that obverse surface of said transfer sheet against said receptor element, (c) applying energy (e.g. heat and/or pressure) to the rear of said transfer sheet to transfer said image to said receptor element, (d) peeling away the substrate to obtain an imaged receptor element such as a fabric, (e) placing a non-stick or tack-free overlay sheet (e.g. thin silicone sheet) over the imaged receptor element such as a fabric, and (f) pressing the overlay sheet (e.g. silicone sheet) by hand ironing to drive the coating into the fabric and removing the overlay sheet.

The present invention further relates to a method of applying an image to a receptor element, which comprises the steps of:

(a) generating an image on an obverse surface of a transfer sheet, said transfer sheet including a substrate, a first coating on said substrate of material transferable from said substrate to a receptor surface by the application of heat or pressure thereto, and a second coating on said first coating, said second coating consisting essentially of a mixture of resin and sugar granules to form an abrasive surface for increasing the receptivity of the transfer sheet;

(b) positioning that obverse surface of said transfer sheet against said receptor element, (c) applying energy (e.g. heat and/or pressure) to the rear of said transfer sheet to transfer said image to said receptor element, (d) peeling away the substrate to obtain an imaged receptor element such as a fabric, (e) placing a non-stick or tack-free overlay sheet (e.g. thin silicone sheet) over the imaged fabric, and (f) pressing the overlay sheet (e.g. silicone sheet) by hand ironing to drive the coating into the fabric and removing the overlay sheet.

Transfer Material Containing Energy Sensitive Resin of U.S. Pat. No. 4,966,815

The invention is further applicable to the transfer sheet of U.S. Pat. No. 4,966,815. Thus, the present invention further relates to a method of applying an image to a receptor element, which comprises the steps of:

(a) electronically generating an image, (b) electronically transferring said image to a printer, (c) printing said image with the aid of said printer on an obverse surface of a transfer sheet, said transfer sheet including a substrate with a first coating thereon transferable therefrom to said fabric by the application of heat or pressure thereto, and a second coating on said first coating, said second coating defining said obverse face and comprising Singapore Dammar resin;

(d) positioning that obverse surface of said transfer sheet against said receptor element, (e) applying energy (e.g. heat and/or pressure) to the rear of said transfer sheet to transfer said image to said receptor element, (f) peeling away the substrate to obtain an imaged receptor element such as a fabric, (g) placing a non-stick or tack-free overlay sheet (e.g. thin silicone sheet) over the imaged receptor element such as a fabric, and (h) pressing the overlay sheet (e.g. silicone sheet) by hand ironing to drive the coating into the fabric and removing the overlay sheet.

The benefits of the present invention are applicable to laser, black and white, and color copiers and printers as well as other copiers and printers such as ink jet.

The following examples are provided for a further understanding of the invention, however, the invention is not to be construed as being limited thereto.

COMPARATIVE EXAMPLE

The following instructions are taken directly from the instructions using Canon T-Shirt Transfers TR-101.

Items required:

Canon T-shirt Transfer paper TR-101

Canon Color Bubble Jet BJC-4000 series or BJC-600 series printer.

Cotton or cotton-poly blend garment or fabric. Light colors work best.

Household hand iron.

Pillow case.

Ironing Surface—use on formica or glass surface only. Do not use ironing board. Be sure that the ironing surface is smooth and free of any imperfections (scratches, dents, etc) as it will affect the transfer.

Printing the Transfer

Insert one transfer sheet into printer with the blank side face up. Do not insert more than one transfer sheet into printer at a time. If lead edge is curled, straighten before feeding.

Set the paper selection lever to the back position.

Use any application to create the image.

Before printing the image, make sure that "Media Options" setting in the printer driver has been set to "Back Print Film". This setting will print the image in reverse on the transfer media so that it will appear correctly when it is ironed on.

Preparing the Transfer

For best results cut away the unprinted portion of the transfer, coming as close to the printed area as possible. If an unprinted portion of the transfer is applied to the fabric it will cause the fabric to become stiff.

Ironing Instructions

The following numbered steps correspond to the steps in the directions in Canon-T-Shirt Transfers TR-101 (copyright 1995); CST-4051-002.

1. Pre-heat iron on "Thighest" setting for 8 minutes.
2. Place the pillowcase, with the seam overhanging the edge, on the ironing surface.
3. Fold the pillowcase in half, with the seam still hanging over the edge of the ironing surface.
4. Place the garment onto the wrinkle-free pillowcase centering the area of the garment which will receive the printed transfer over the pillowcase. Be sure garment is wrinkle-free.
5. Center transfer, printed side down onto the garment (making certain the entire transfer is over the pillowcase). Before ironing, make a small fold in lower left corner of transfer. Only ¼" fold is necessary. Do not fold beyond the edge of printed area underneath. This fold will provide a good grip from which to peel the transfer.
6. Place the iron over both edges of the transfer, beginning in the upper left corner. The hand iron will always be positioned point facing down for each step.
7. Starting from one edge, push iron slowly along the long side of the transfer for at least 15 seconds using firm body pressure while pressing down on iron. Be certain iron overlaps all edges of transfer. While pushing iron, count 1,000, 2,000, 3,000 up to 15,000. This will take approximately 15 seconds.
8. Reposition iron over both edges of the transfer beginning in the lower left corner.
9. Starting from one edge, push iron slowly along long side of transfer for 15 seconds using firm body pressure while pressing down iron. Be certain iron overlaps all edges of transfer.
10. Repeat Steps 6 through 9.
11. Immediately reheat entire surface by making 10 complete circles with iron over the transfer, being absolutely certain that the flat bottom of the iron covers the entire surface of the transfer paying special attention to all edges and corners.
12. Immediately place iron asides beginning with folded-in corner, peel transfer from fabric using firm, steady pressure. If transfer is difficult to peel from shirt, do not fight it. Simply reheat that section of transfer which does not release by making three light circles, covering all edges and corners with flat part of iron. Place iron down immediately and peel while hot.
13. Gently smooth the fabric with your hands and allow to cool for at least at 2 minutes.

Inventive Example 1

Repeat steps 1–12 of the comparative example. After step 12 or optionally after step 13, place a silicone sheet over the imaged fabric. Press the silicone sheet by hand ironing at the highest setting on the iron to drive the coating into the valleys of the fabric by repeating steps 6–9 of the Comparative Example (with the silicone sheet), except change the time from 15 to 30 seconds for each of steps 7 and 9.

Inventive Example 2

Figure 2:
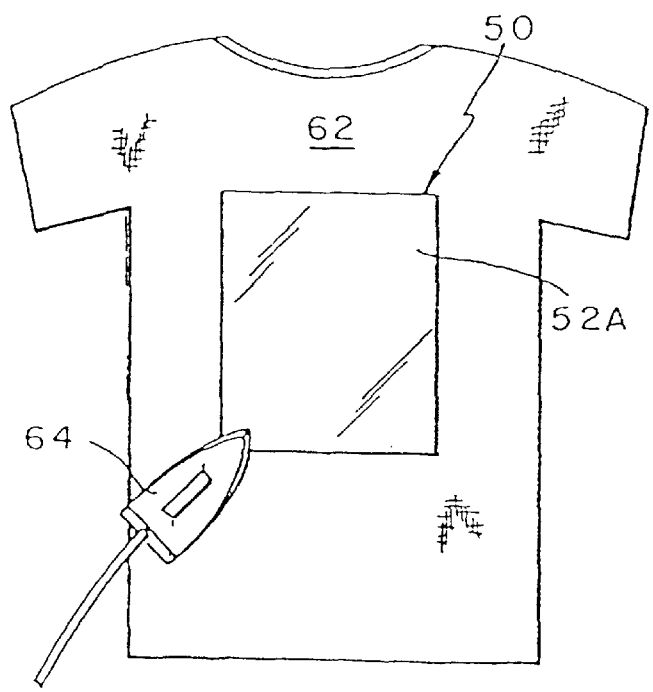

Referring to FIG. 2, the method of applying the image and non-image areas to a receptor element will be described. The imaging sheet 50 is prepared, exposed and developed to form an image as in Example 1 of U.S. Pat. No. 5,139,917. A receptor element (e.g., tee shirt 62) is laid flat as illustrated, on an appropriate support surface, and the front surface of the imaging sheet 50 is positioned on the tee-shirt. An iron 64 is run and pressed across the back 52A of the imaging sheet. The image and non-image areas are transferred to the tee-shirt and the support is removed and discarded. Place a silicone sheet over the imaged fabric. Press the silicone sheet by hand ironing at the highest setting on the iron to drive the coating into the valleys of the fabric by repeating steps 6–9 of the Comparative Example (with the silicone sheet), except change the time from 15 to 30 seconds for each of steps 7 and 9.

The contents of each of the above-mentioned U.S. patents, copending applications and provisional applications are herein incorporated by reference.

The invention being thus described, it will be obvious that the same may be varied in many ways. Such variations are not to be regarded as a departure from the spirit and scope of the present invention, and all such modifications as would be obvious to one skilled in the art are intended to be included within the scope of the following claims.

We claim:

1. A method for applying an image to a receptor element, which comprises the steps of:
   (i) providing a transfer sheet comprising a support having a first surface and a second surface, and a coating capable of receiving an image on the first surface of the support,
   (ii) imaging the coating,
   (iii) dry peeling the coating from the support in the absence of wet release prior to hand ironing.
   (iv) positioning the dry peeled coating on a receptor element having valleys or pores,
   (v) positioning a non-stick sheet on the dry peeled coating which is positioned on the receptor element having valleys or pores, and
   (vi) hand ironing the non-stick sheet to drive the dry peeled coating into the receptor element having valleys or pores.

2. A method for applying an image to a receptor element, which comprises the steps of:
   (i) providing a transfer sheet comprising a support having a first surface and a second surface, and a coating capable of receiving an image on the first surface of the support, wherein an effective amount of a non-stick material for peeling the coating from the support is provided on the first surface of the support beneath the coating capable of receiving the image,
   (ii) imaging the coating,
   (iii) dry peeling the coating from the support in the absence of wet release,
   (iv) positioning the dry peeled coating on a receptor element having valleys or pores,
   (v) positioning a non-stick sheet on the dry peeled coating which is positioned on the receptor element having valleys or pores, and
   (vi) hand ironing the non-stick sheet to drive the dry peeled coating into the receptor element having valleys or pores.

3. The method of claim 1, wherein in step (ii), the coating is imaged with a laser copier or printer.

4. The method of claim 2, wherein in step (ii), the coating is imaged with a laser copier or printer.

5. The method of claim 1, wherein the receptor element having valleys or pores is a textile, leather, ceramic, wool, glass, plastic, metal, canvas, paper, or a receptor support used by the museum or conservatory industry.

6. The method of claim 1, wherein the non-stick sheet is a silicone sheet.

7. The method of claim 2, wherein the receptor element having valleys or pores is a textile, leather, ceramic, wool, glass, plastic, metal, canvas, paper, or a receptor support used by the museum or conservatory industry.

8. The method of claim 2, wherein the non-stick sheet is a silicone sheet.

9. A method for applying an image to a receptor element, which comprises the steps of:
   (i) providing a transfer sheet comprising a support having a first surface and a second surface, and a coating capable of receiving an image on the first surface of the support,
   (ii) imaging the coating,
   (iii) dry peeling the coating from the support in the absence of wet release prior to hand ironing,
   (iv) positioning the dry peeled coating on a receptor element,
   (v) positioning a non-stick sheet on the dry peeled coating which is positioned on the receptor element, and
   (vi) hand ironing the non-stick sheet to drive the dry peeled coating into the receptor element.

10. A method for applying an image to a receptor element, which comprises the steps of:
    (i) providing a transfer sheet comprising a support having a first surface and a second surface, and a coating capable of receiving an image on the first surface of the support, wherein an effective amount of a non-stick material for peeling the coating from the support is provided on the first surface of the support beneath the coating capable of receiving the image,
    (ii) imaging the coating,
    (iii) dry peeling the coating from the support in the absence of wet release,
    (iv) positioning the dry peeled coating on a receptor element,
    (v) positioning a non-stick sheet on the dry peeled coating which is positioned on the receptor element, and
    (vi) hand ironing the non-stick sheet to drive the dry peeled coating into the receptor element.

* * * * *